(12) United States Patent
Iriguchi

(10) Patent No.: US 7,258,957 B2
(45) Date of Patent: Aug. 21, 2007

(54) METHOD FOR ALIGNING EXPOSURE MASK AND METHOD FOR MANUFACTURING THIN FILM DEVICE SUBSTRATE

(75) Inventor: Chiharu Iriguchi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 14 days.

(21) Appl. No.: 11/235,262

(22) Filed: Sep. 27, 2005

(65) Prior Publication Data

US 2006/0068305 A1 Mar. 30, 2006

(30) Foreign Application Priority Data

Sep. 27, 2004 (JP) ............................. 2004-280045

(51) Int. Cl.
*G03F 9/00* (2006.01)
(52) U.S. Cl. .............................. 430/22; 430/1; 430/30; 356/401; 359/12; 359/15; 359/35
(58) Field of Classification Search .................. 430/1, 430/22, 30; 359/12, 15, 35; 356/401
See application file for complete search history.

(56) References Cited

U.S. PATENT DOCUMENTS 6,329,104 B1 * 12/2001 Clube et al. ................... 430/1

OTHER PUBLICATIONS

Francis Clube, et al., "P-40: 0.5 μm Enabling Lithography for Low-Temperature Polysilicon Displays", SID 03 DIGEST, 2003, pp. 350-353.
Ali Reza Nobari, et al., "Magnification Compensating 0.4 μm Exposure System for Peripheral ICs", IDW '04, pp. 765-766.

* cited by examiner

*Primary Examiner*—Christopher G. Young
(74) *Attorney, Agent, or Firm*—Oliff & Berridge, PLC

(57) ABSTRACT

A method for aligning an exposure mask, comprises: using a plurality of hologram masks, on which alignment marks are formed,; aligning position of the hologram masks toward an object, which is exposed and on which alignment marks are also formed, a plurality of times by using both alignment marks, wherein a first straight line connects a first area on the object to be exposed for a pattern exposure with the alignment mark for aligning with a holographic mask that is used in an exposure onto the first area and a second straight line connects the other area, adjacent to the first area, on the object to be exposed for a pattern exposure with the other alignment mark for aligning with a holographic mask that is used in an exposure onto the another area, and the first straight line and the second straight line are intersected each other.

7 Claims, 10 Drawing Sheets

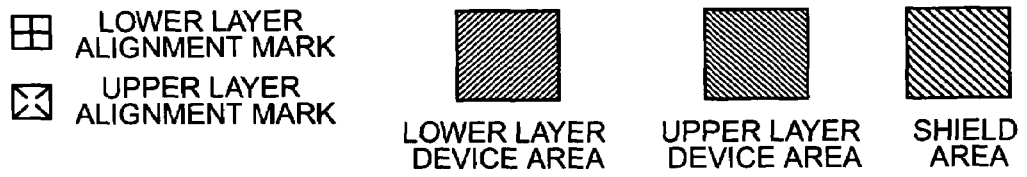
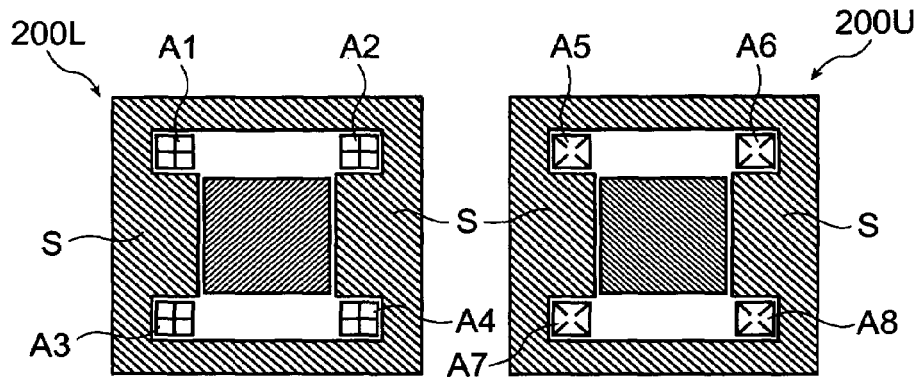
FIG. 3A    FIG. 3B
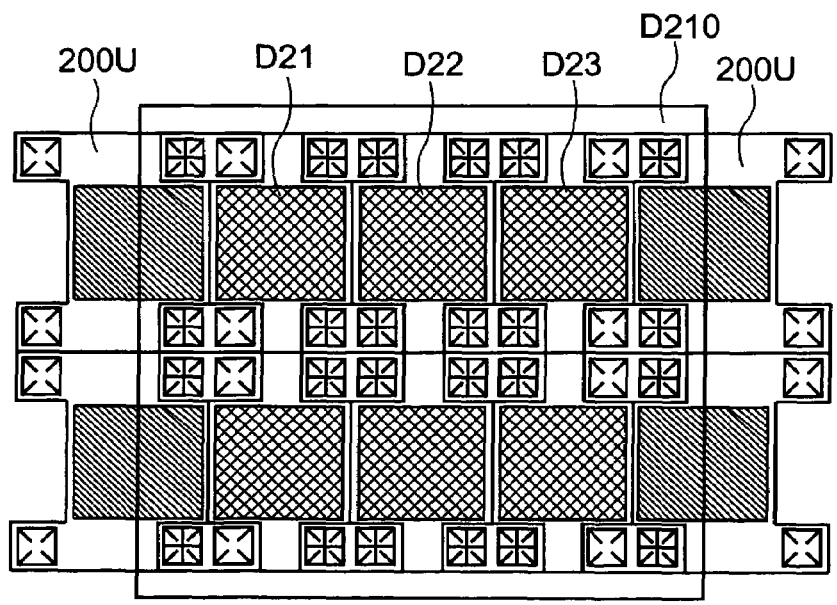
FIG. 4

METHOD FOR ALIGNING EXPOSURE MASK AND METHOD FOR MANUFACTURING THIN FILM DEVICE SUBSTRATE

RELATED APPLICATION INFORMATION

This application claims priority to Japanese Application No. 2004-280045, filed Sep. 27, 2005, whose contents are expressly incorporated herein by reference.

BACKGROUND OF THE INVENTION

1. Technical Field

The present invention relates to fine patterning using exposure technologies, such as holography. Specifically, the invention relates to a method for aligning an exposure mask and an object to be exposed, and a method for manufacturing a thin film device substrate using the method.

2. Related Art

In recent years, Total Internal Reflection (TIR) holographic exposure technology has been a focus of attention as a patterning process for semiconductor devices. This exposure technology includes recording a desired pattern onto a holographic mask by using a holographic exposure system, and exposing a photoresist for a circuit pattern by irradiating a reconstructing beam onto the holographic mask.

In the recording, a recording laser beam is irradiated onto a mask pattern (former reticle) that corresponds to a pattern for a semiconductor device, producing a diffracted beam to be radiated onto a recording surface of a holographic mask. Meanwhile, a reference beam is irradiated onto the recording surface of the holographic mask from the opposite side of the holographic mask at a predetermined angle so as to interfere with the diffracted beam emitted from the original reticle. In this way, an interference pattern is produced and then recorded on the recording surface of the holographic mask.

In the exposing, an exposing beam, which is a reconstructing beam, is irradiated, from the opposite direction to that in the recording, onto the holographic mask that is placed on the same position as in the case of the original reticle so as to expose a photoresist together with a diffracted beam that reconstructs the original pattern on the photoresist. Generally, in the exposing, a substrate and a holographic mask are positioned appropriately by overlapping the alignment marks formed on the substrate, which is an object to be exposed, and the alignment marks formed on the holographic mask.

In the case where a patterning is done using a plurality of holographic masks, the alignment of a substrate and the holographic masks is generally done using a substrate on which alignment marks are respectively formed on the positions that correspond to each set of alignment marks formed on each of the plural holographic masks, as described in a document of related art, Symposium of Image Display (SID)03 Digest, P-40, pp.350-353.

Therefore, there is a problem that as many sets of alignment marks as holographic masks have to be placed on a substrate, requiring more alignment marks on a substrate in proportion to the increasing number of holographic masks to be used, which eventually requires a larger area on a substrate for forming alignment marks.

In the holographic exposure system, alignment marks to be placed on holographic masks need to be formed separately from device areas. Specifically, it is necessary to form alignment marks at an interval of about 5 mm from device areas and from alignment marks for other holographic masks (other layers), for the sake of accuracy of a manufacturing system (refer to FIGS. 11 and 12).

FIGS. 11A and 11B are two-dimensional diagrams schematically showing a first layer mask and a second layer mask, each being an original Cr mask (an former reticle) for forming a holographic mask. As shown in FIG. 11A, the first layer mask includes a first layer device area D1 in the center and a first layer alignment mark A1 on each corner. Meanwhile, as shown in FIG. 11B, the second layer mask includes a second layer device area D2 in the center and a second layer alignment mark A2 on each corner. The pattern of the alignment mark A1 and the pattern of the alignment mark A2 are different from each other.

FIGS. 12A and 12B are diagrams schematically showing procedures on the holographic mask (the second layer mask) for recording a device area and for recording alignment marks, respectively. As shown in FIG. 12A, in the recording of a device area, recording is done onto the holographic mask, with the four alignment marks A2 on the original Cr mask 2 closed with light shields, by an object beam passing through the device area D2 and a reference beam passing through a prism. Meanwhile, as shown in FIG. 12B, in the recording of alignment marks, recording is done onto the holographic mask, with the device area D2 closed with a light shield, by an object beam passing through the four alignment marks A2 on the original Cr mask 2. Here, on the resulting holographic mask, the alignment marks and the device area are placed at an interval of about 5 mm from each other. Further, although it is not shown in the drawings, in the case where more alignment marks for other layers are placed on the same mask with the first four alignment marks, each of the alignment marks is placed at an interval of about 5 mm from each other.

In the case of a combined exposure, the upper layer alignment marks are patterned overlappingly onto the lower layer alignment marks, making them unreusable for alignments in further exposures.

SUMMARY

In order to solve the above problem, the invention is intended to provide a method for aligning an exposure mask that can reduce a needed area on a object to be exposed for alignment marks while keeping minimum permissible intervals among alignment marks on a same exposure mask and that makes alignment marks on a object to be exposed reusable, and a method for manufacturing a thin film device substrate using the method.

Therefore, aspects of the invention provide a method for aligning an exposure mask as described below.

According to a first aspect of the invention, a method for aligning an exposure mask includes: using a plurality of hologram masks, on which an alignment mark is formed,; aligning position of the hologram masks toward an object, which is exposed and on which an alignment mark is also formed, a plurality of times by using both alignment marks. Further, each alignment mark is placed so that a first straight line connecting a first area on the object to be exposed for a pattern exposure with an alignment mark for aligning with a holographic mask that is used in an exposure onto the first area and a second straight line connecting another area, adjacent to the first area, on the object to be exposed for a pattern exposure with an alignment mark for aligning with a holographic mask that is used in an exposure onto the another area may intersect.

According to the first aspect of the invention, a needed area on an object to be exposed for alignment marks can be reduced while minimum permissible intervals are kept among alignment marks on a same exposure mask. In addition, in the case of a combined exposure, the upper layer alignment marks are not patterned overlappingly onto the lower layer alignment marks, making them reusable for alignments in further exposures. Specifically, the alignment marks on the object to be exposed can be reused. Here, although the straight line connecting a first area or other areas with a corresponding alignment mark may be any straight line connecting any point on the area with any point on the alignment mark, a straight line connecting a center (barycenter) of the first area or the other areas with a center of the corresponding alignment mark is preferable.

Further other aspects of the invention are described below.

The holographic mask to be used in an exposure onto the first area may have a form that allows at least the other areas to be shielded. According to the method, a needed area on the object to be exposed for alignment marks can be efficiently reduced.

A method for manufacturing a thin film device substrate of the invention uses a holographic exposure that includes a pattern exposure using a plurality of holographic masks on which alignment marks are formed. Further, the method may include; using the method for aligning in the above first aspect of the invention; and irradiating an exposing beam onto the object to be exposed through the holographic masks as a way of patterning.

According to the method, an integrated device with higher density is provided because the area available for forming a circuit pattern of a thin film device substrate to be used for devices, such as semiconductor devices, can be extended.

The method for manufacturing a thin film device substrate of the invention may use a holographic exposure that includes a pattern exposure using a plurality of holographic masks on which alignment marks are formed. The method includes; recording desired patterns including alignment marks on the holographic masks; aligning an exposure mask according to the above first aspect of the invention; and irradiating an exposing beam onto the object to be exposed through the holographic masks as a way of patterning.

According to the method, an integrated device with higher density is provided because the area available for forming a circuit pattern of a thin film device substrate to be used for devices, such as semiconductor devices, can be extended.

In the above method for manufacturing a thin film device substrate, alignment marks may be formed on the object to be exposed during the first pattern exposure onto the object to be exposed. According to the method, operation procedures can be reduced and manufacturing efficiency can eventually be improved because there is no need to separately form alignment marks on the object to be exposed.

These aspects of the invention provide a method for aligning an exposure mask that can reduce a needed area on the object to be exposed for alignment marks while keeping minimum permissible intervals among alignment marks on a same exposure mask and that makes alignment marks on the object to be exposed reusable, and a method for manufacturing a thin film device substrate that can form an integrated device with higher density.

BRIEF DESCRIPTION OF THE DRAWINGS

The invention will be described with reference to the accompanying drawings, wherein like numbers refer to like elements, and wherein:

FIG. 3A is a two-dimensional diagram showing an example of lower layer holographic masks, and FIG. 3B is a two-dimensional diagram showing an example of upper layer holographic masks;

FIG. 4 is a diagram explaining a method for aligning an exposure mask according to the embodiment (a two-dimensional diagram showing an upper layer exposure pattern);

DESCRIPTION OF THE EMBODIMENTS

Figure 1:
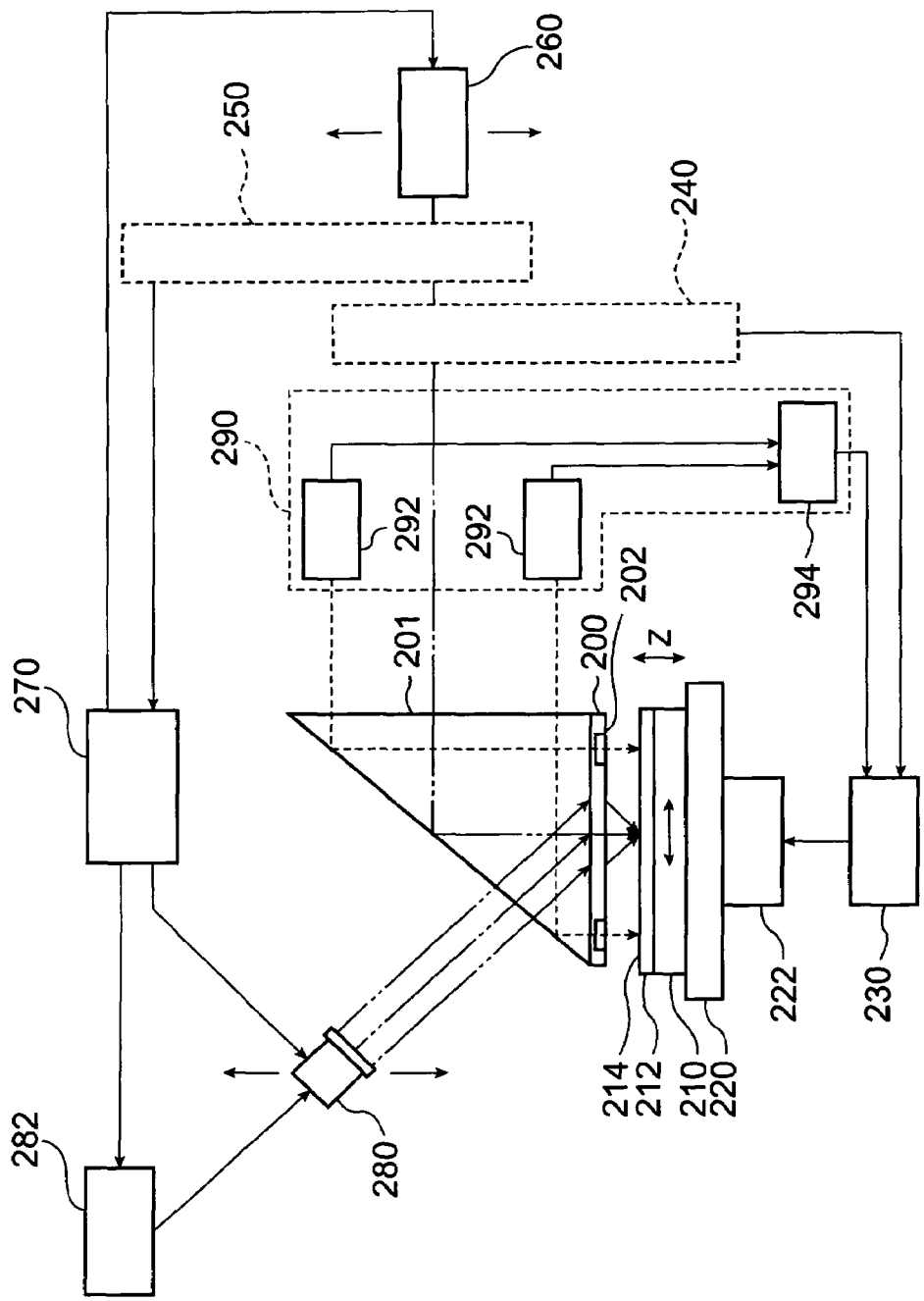
FIG. 1 is a diagram schematically showing a holographic exposure system for providing a method for aligning an exposure mask according to an embodiment of the invention.

Embodiments of the invention will now be described with reference to the drawings. The invention is not limited to the embodiments described below. FIG. 1 is a diagram schematically showing a holographic exposure system for providing a method for aligning an exposure mask according to an embodiment of the invention.

As shown in FIG. 1, the exposure system mainly includes a prism 201, a stage system 222 having a stage 220, a first information processing unit 230, a distance measuring optical system 240, a film thickness measuring optical system 250, a light source 260, a second information processing unit 270, an exposure light source 280, an exposure light source drive unit 282, and an alignment system 290.

The stage system 222 holds an exposed substrate 210, which is an object to be exposed and on which a light sensitive material film 212 is formed, on the stage 220 via a vacuum chuck or the like, and can adjust the position of the stage 220 vertically (along the Z-axis) and horizontally (on the XY level.)

The light source 260 can radiate measuring light beams for the distance measuring optical system 240 and for the film thickness measuring optical system 250. The distance measuring optical system 240 includes a beam splitter, a cylindrical lens, a light sensor, an error signal sensor and so on, so as to control the focus during the exposure by adjusting the distance between a hologram recording surface 202 and a light sensitive material film surface 214 that is formed on the exposed substrate 210.

The first information processing unit 230 sets up the position of the stage 220 so that the focus may be appropriately set according to the distance, measured by the distance measuring optical system 240, between the hologram recording surface 202 and the light sensitive material film surface 214 that is formed on the exposed substrate 210. The film thickness measuring optical system 250 includes a beam splitter, a photodetector, an amplifier, an A/D converter and so on, so as to measure the film thickness of the light sensitive material film 212 that is formed on the exposed substrate 210.

The second information processing unit 270 moves the exposure light source 280 so that the exposing beam irradiated from the exposure light source 280 may scan within an appropriate exposure area. The unit also controls the exposure light intensity according to the relative value of the film thickness of the light sensitive material film 212 that is output by the film thickness measuring optical system 250.

The exposure light source 280 can irradiate an exposing beam onto the hologram recording surface 202 of the holographic mask 200. The exposure light source drive unit 282 scans and exposures a desired exposure area on the exposed substrate 210 by moving the exposure light source 280. The exposure system includes a prism 201 that has, on the opposed side to the exposed substrate 210, a holographic mask 200 on which an interference pattern corresponding to a predetermined reticle pattern is recorded.

The alignment system 290 includes a section that monitors alignment marks and a section that detects, according to the information provided by the monitoring section, alignment errors between the alignment marks on the holographic mask 200 and the alignment marks on the exposed substrate 210.

According to the embodiment, a microscope 292, which is a monitoring section, monitors the alignment marks formed on the exposed substrate 210 through the holographic mask 200. The microscope 292 has an image importing device, such as a CCD camera, for importing images of the monitored alignment marks. The images of the alignment marks on the holographic mask 200 and the images of the alignment marks on the exposed substrate 210 that are monitored by the microscope 292 and are imported by the image importing device are converted into image signals and are sent to an alignment error sensor 294, which is a section for detecting alignment errors.

The alignment error sensor 294 extracts, from the image signals, characterizing points of the alignment marks on the holographic mask 200 and of the alignment marks on the exposed substrate 210 to calculate the distance between the characterizing points. For example, in the case where alignment marks in the shape of a cross are formed on the exposed substrate 210 and alignment marks in the shape of an "x" are formed on the holographic mask 200, the intersection of the cross and the intersection of the "x", for example, are extracted respectively as a characterizing point to calculate the distance between the intersections. The calculated distance information is sent to the first information processing unit 230.

The first information processing unit 230 also sets up the position of the exposed substrate 210 by moving the stage system 222 in the direction of XY axis so that the distance between the alignment marks (the amount of misalignment) may be reduced. Thus, the holographic mask 200 and the exposed substrate 210 can be aligned.

Figure 2:
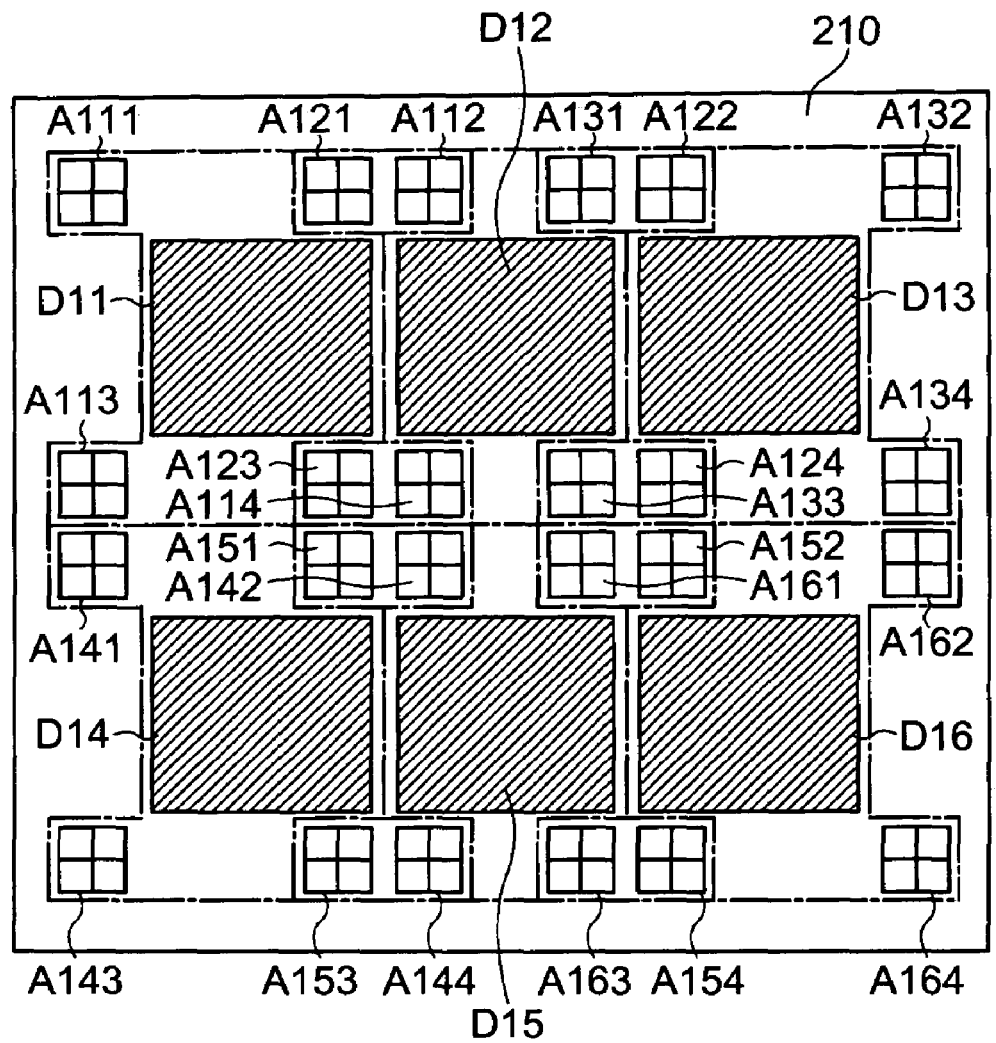
FIG. 2 is a diagram explaining a method for aligning an exposure mask according to the embodiment (a two-dimensional diagram showing a lower layer exposure pattern on the object to be exposed)

The holographic mask 200 and the exposed substrate 210 are aligned in such a way that a lower layer exposure pattern on the exposed substrate 210 may be like the one shown in FIG. 2. Here, FIG. 2 is a two-dimensional diagram showing a lower layer exposure pattern in the case where a patterning of two layers (a lower layer and an upper layer) is done, using a plurality of holographic masks 200, on the exposed substrate 210 for producing devices and the like.

As shown in FIG. 2, according to the embodiment, a predetermined area on the exposed substrate 210 is exposed through a lower layer holographic mask 200 to produce, along with a first lower layer area D11, which is rectangle and patterned, four alignment marks in the shape of a cross, A111, A112, A113, and A114 for aligning with the upper layer holographic mask 200 on the extension of the diagonal lines of the lower layer area D11 at predetermined intervals. Then, an exposure is done through the lower layer holographic mask 200 to produce, along with a second lower layer area D12, which is adjacent to the lower layer area D11, rectangle, and patterned, four alignment marks in the shape of a cross, A121, A122, A123, and A124 for aligning with the upper layer holographic mask 200 on the extension of the diagonal lines of the second lower layer area D12 at predetermined intervals. Subsequently, an exposure is done through the lower layer holographic mask 200 to produce, along with a third lower layer area D13, which is adjacent to the second lower layer area D12, rectangle, and patterned, four alignment marks in the shape of a cross, A131, A132, A133, and A134 for aligning with the upper layer holographic mask 200 on the extension of the diagonal lines of the third lower layer area D13 at predetermined intervals.

A holographic mask 200 to be used here for the lower layer has a predetermined shield area S, such as a holographic mask 200L shown in FIG. 3A. The holographic mask 200L includes alignment marks, A1, A2, A3, and A4 for producing predetermined alignment marks on the exposed substrate 210, having a form that allows at least the other lower layer areas to be shielded in the exposing of the first lower layer area. Specifically, the holographic mask 200L, in the case of exposing, for example, a first lower layer area D11, exposes the lower layer area D11 while shielding a second lower layer area D12, adjacent to the first lower layer area D11, with the shield area S. Further, the holographic mask 200L, in the case of exposing, for example, the second lower layer area D12, exposes the second lower layer area D12 while shielding both the first lower layer area D11 and the a third lower layer area D13, which are both adjacent to the second lower layer area D12, with the shield area S.

Similarly, a fourth lower layer area D14, which is rectangle and patterned, and alignment marks A141, A142, A143, and A144 for aligning with the upper layer holographic mask 200, a fifth lower layer area D15 and alignment marks A151, A152, A153, and A154, and a sixth lower layer area D16 and alignment marks A161, A162, A163, and A164 are formed on the exposed substrate 210. Thus, the exposed substrate 210 that has a lower layer exposure pattern, as shown in FIG. 2, is completed.

Next, an alignment is done for an upper layer patterning onto the exposed substrate 210, using an upper layer holographic mask 200. As an upper layer holographic mask 200 to be used here, a holographic mask 200U that includes a mask pattern having a predetermined shield area S, for example, as shown in FIG. 3B, may be used. The holographic mask 200U, having a form that is nearly same with the holographic mask 200L for the lower layer, has alignment marks, A5, A6, A7, and A8 in the shape of an "x" for aligning with the exposed substrate 210 using the given alignment marks in the shape of a cross on the exposed substrate 210 and allows at least the other upper layer areas to be shielded in exposing a first upper layer area. Specifically, in the case of exposing, for example, a second upper layer area D22, the holographic mask 200U makes it possible to expose only the second upper layer area D22 while shielding both a first upper layer area D21 and a third upper layer area D23, adjacent to the second upper layer area D22, with the shield area S. FIG. 4 is a two-dimensional diagram showing an exposure pattern in exposing, on the lower layer exposure pattern of the exposed substrate 210 shown in FIG. 2, an upper layer through the upper layer holographic mask 200.

Thus, according to the embodiment, alignment marks for an alignment (for example, A112 and A121) are placed so that a straight line connecting a first lower layer area on an exposed substrate 210 (for example, D11) on which a pattern exposure has been done with an alignment mark (A112) for aligning a first upper layer holographic mask 200U to be used in the exposure of a first upper layer area (for example, D21) onto the first lower layer area, and another straight line connecting a second lower layer area on the exposed substrate 210 (for example, D12), adjacent to the first lower layer area (D11), for the pattern exposure with an alignment mark (A121) for aligning the first upper layer holographic mask 200U to be used in the exposure onto a second upper layer area (for example, D22) corresponding the second lower layer area may intersect. Thus, a needed area for alignment marks on the exposed substrate 210, which is a object to be exposed, can be reduced while minimum permissible intervals are kept among alignment marks on a same holographic mask 200. According to an embodiment of the invention, at least one alignment mark should have the above-referenced position relationship. But it is also acceptable to place a plurality of alignment marks in the relationship.

Figure 5A:
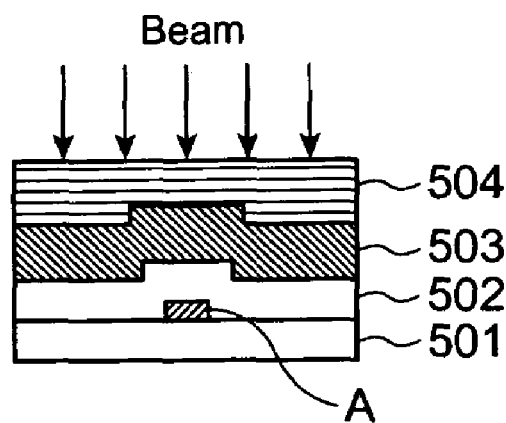
FIGS. 5A to 5C are sectional views of an alignment mark on an exposed substrate, representing that during the exposure, that after the development, and that after the etching, respectively.
Figure 5B:
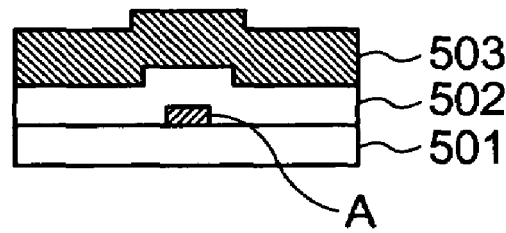
Figure 5C:
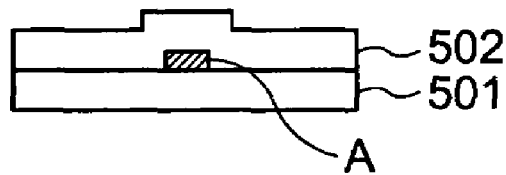
Figure 6:
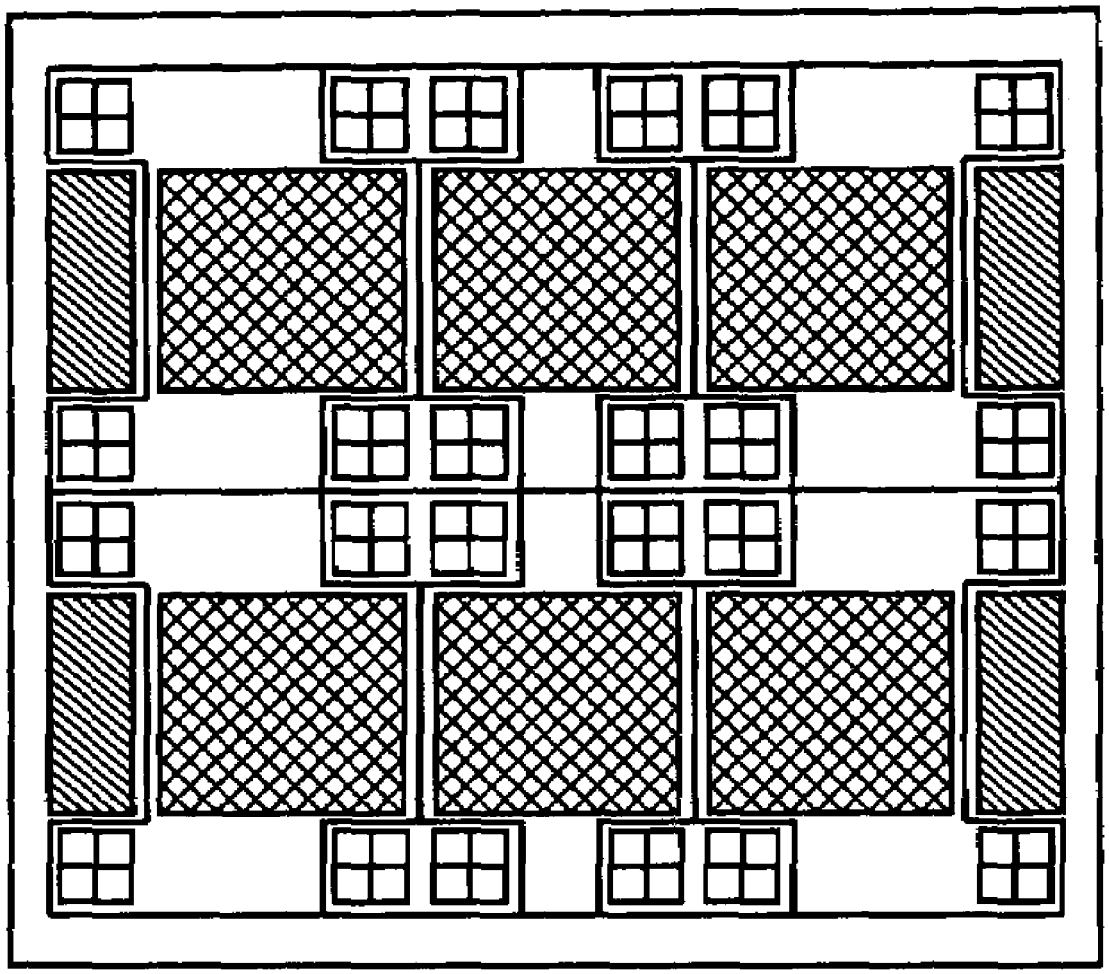
FIG. 6 is a two-dimensional diagram showing an exposed substrate after the development that corresponds to FIG. 5B.

According to the embodiment, alignment marks change during the patterning, for example, as shown in FIG. 5. Here, FIGS. 5A to 5C are sectional views of an alignment mark on an exposed substrate, representing that during the exposure, that after the development, and that after the etching, respectively. As shown in FIG. 5A, an exposure is done by an exposure beam onto a photoresist 504 that is placed on a surface of a lamination where a thin film layer (such as SiO2) 502, a patterning layer 503, and a photoresist 504 are sequentially laminated on an alignment mark A on a lower layer exposed substrate 501. Thus, the photoresist 504 is removed after the development, and a shape of a cross corresponding to the lower layer alignment mark A comes to the fore of the patterning layer 503 in the lamination, as shown in FIG. 5B. The pattern after the development may be such as shown in FIG. 6. Further, the patterning layer 503 is removed after the etching, and a shape of a cross corresponding to the lower layer alignment mark A comes to the fore of the thin film layer 502 in the lamination, as shown in FIG. 5C. In this way, the alignment mark area (the shape of a cross corresponding to the lower layer alignment mark A) can be used as an alignment mark also in the case of a combined exposure in the future because alignment marks in the shape of an "x" on an upper layer holographic mask are not patterned on the alignment marks area.

A method for manufacturing a thin film device substrate according to the embodiment of the invention will now be described with reference to the drawings 7 to 10.

For a start, a first patterning is done. As shown in FIG. 7A, an interference pattern corresponding to a first reticle pattern is recorded, using, for example, a first original Cr Mask 300 (also called an original reticle), onto a hologram recording surface 202 of a holographic mask 200a that is attached on a prism 201. The first reticle pattern includes at least a pattern corresponding to a thin film circuit including a thin film device on an aimed thin film device substrate.

Specifically, a recording beam L1 (an object beam) is irradiated onto a first original mask 300. Then, a diffracted beam passing through the first original mask 300 is radiated onto the hologram recording surface 202 of the holographic mask 200a. The recording beam L1 passing through the first original mask 300 and a reference beam L2 irradiated through the prism 201 form the other side of the hologram recording surface 202 are interfered each other. Thus, an interference pattern having a desired pattern is recorded on the hologram recording surface 202.

Figure 7B:
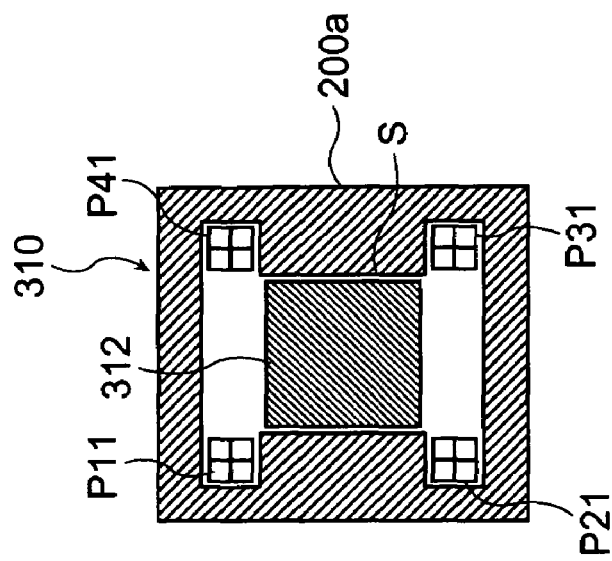
FIG. 7 is a diagram explaining a method for manufacturing a thin film device substrate according to the embodiment.
Figure 7A:
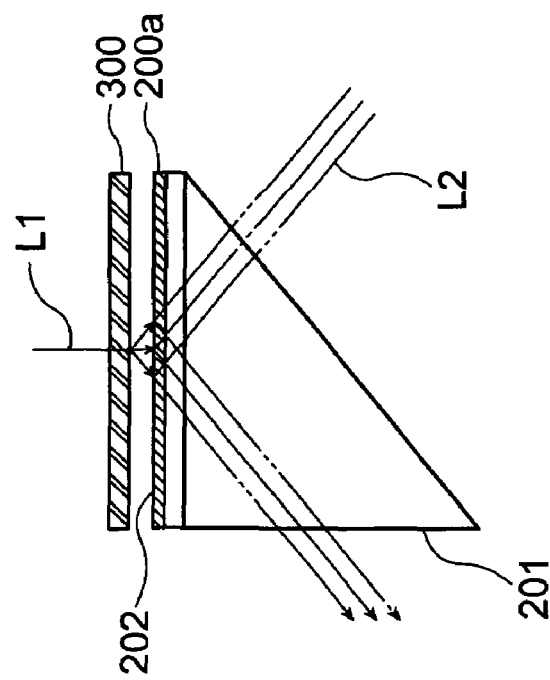

FIG. 7B is a diagram showing an example of a holographic mask 200a on which a first interference pattern 310 is formed. As shown in FIG. 7B, the first interference pattern 310 includes an interference pattern 312 that corresponds to a first circuit pattern for composing a thin film circuit and interference patterns P11, P21, P31, and P41 as alignment marks. On the holographic mask 200a, a predetermined shield area S is placed.

Figure 8:
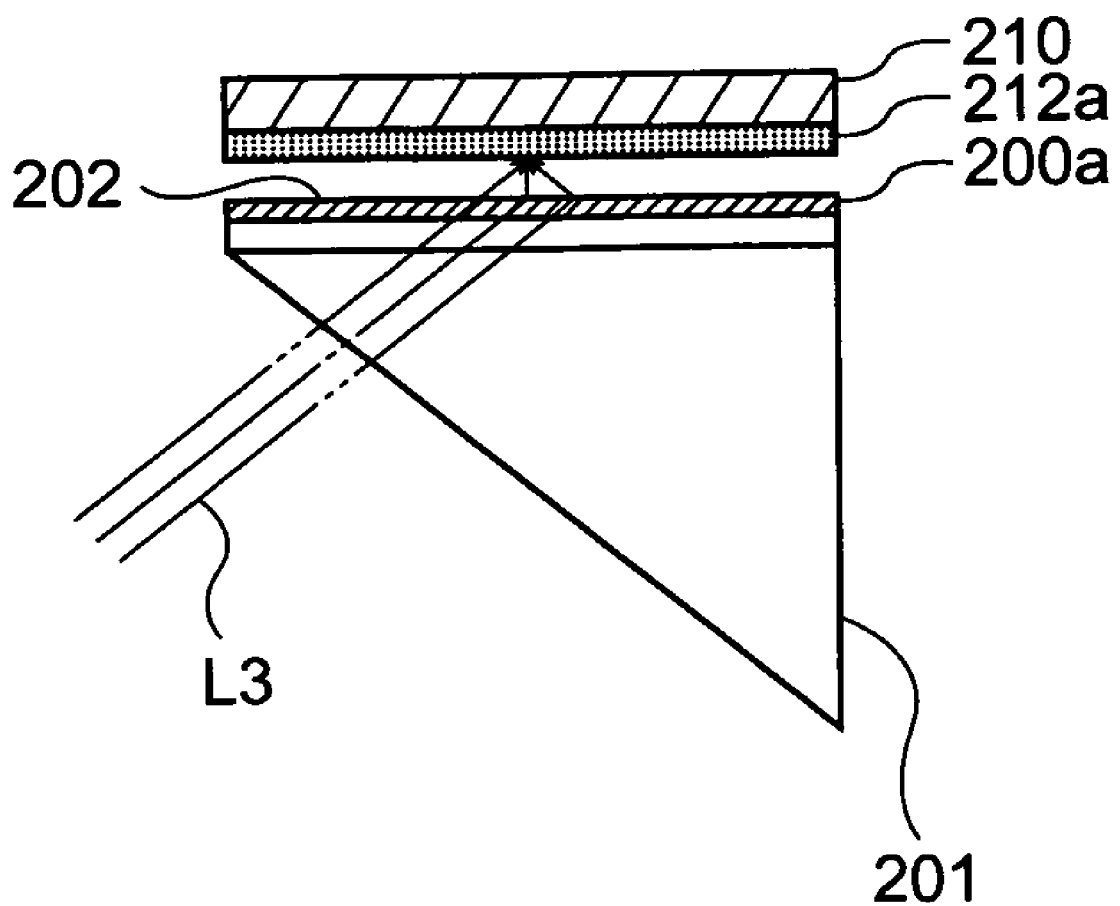
FIG. 8 is a diagram explaining a method for manufacturing a thin film device substrate according to the embodiment.

Next, as shown in FIG. 8, an exposed substrate 210, instead of an original mask 300, on which a first light sensitive material film 212a is formed is placed on the position where the original mask 300 has been placed. Then, an exposing beam L3, which is a reconstructing beam, is irradiated onto the hologram recording surface 202 through the prism 201, from the opposite direction of the input direction of the reference beam L2 in FIG. 7A (from the output direction of the reference beam L2), to expose the first light sensitive material film 212a that is formed on the exposed substrate 210. Here, the prism 201 is turned around so that the inclined plane of the prism 201 may face the input direction of the exposing beam L3, the holographic mask 200a being refixed onto the prism 201. Thus, a pattern that corresponds to the first interference pattern 310 recorded on the hologram recording surface 202 is formed on the exposed substrate 210.

An example of patterns that is formed by the first interference pattern 310 is same with the pattern shown in FIG. 2. Specifically, as shown in FIG. 2, alignment marks A111, A112, . . . that correspond to the interference patterns P11, P21, P31, and P41 on the holographic mask 200a and a first circuit pattern that corresponds to an interference pattern 312 is formed on areas D11, D2, . . . . Then, necessary procedures, such as development and etching, are done to complete a first patterning.

Next, a second patterning is done. As shown in FIG. 9A, an interference pattern corresponding to a second reticle pattern is recorded, using, for example, a second original Cr mask 302, onto a hologram recording surface 202 of a holographic mask 200b that is attached on the prism 201. The second reticle pattern includes at least a pattern corresponding to a thin film circuit including a thin film device on an aimed thin film device substrate. The recording of the interference pattern is done in the same way as that in FIG. 7A. Further, in addition to the recording of the interference pattern, alignment marks P12, P22, P32, and P42 are formed on the hologram recording surface 202 of the holographic mask 200b by irradiating only an object beam L1.

Figure 9B:
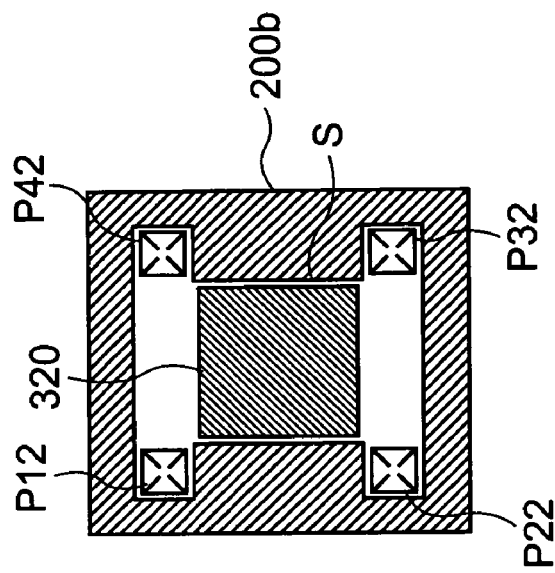
FIG. 9 is a diagram explaining a method for manufacturing a thin film device substrate according to the embodiment.
Figure 9A:
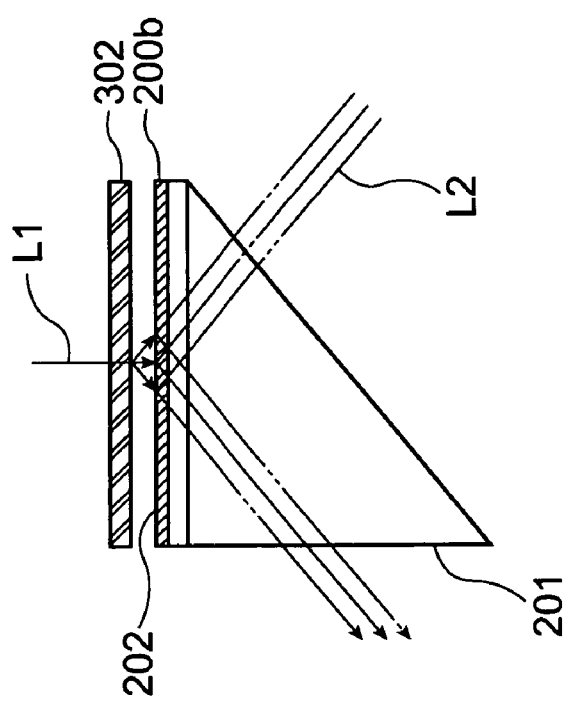

FIG. 9B is a diagram showing an example of a holographic mask 200b on which a second interference pattern and a second set of alignment marks are formed. As shown in FIG. 9B, the second interference pattern includes an interference pattern 320 that corresponds to a second circuit pattern for composing a thin film circuit. Further, on the four corners of the holographic mask 200b, alignment marks P12, P22, P32, and P42 are formed for aligning the holographic mask 200b and the exposed substrate 210. On the holographic mask 200b, a predetermined shield area S is placed.

Figure 10:
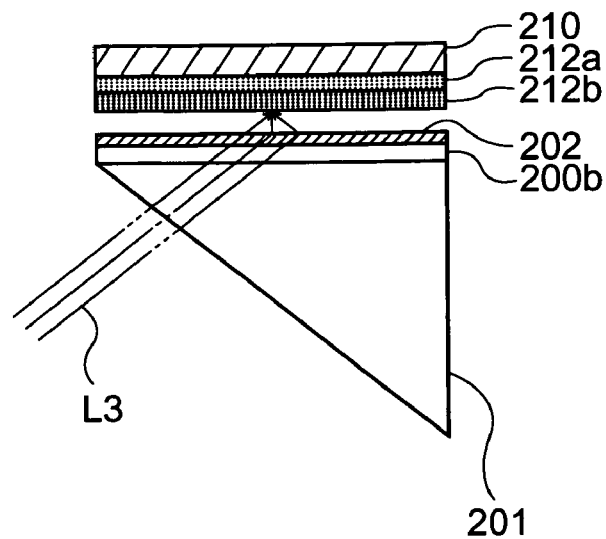
FIG. 10 is a diagram explaining a method for manufacturing a thin film device substrate according to the embodiment.
Figures 11A, 11B:
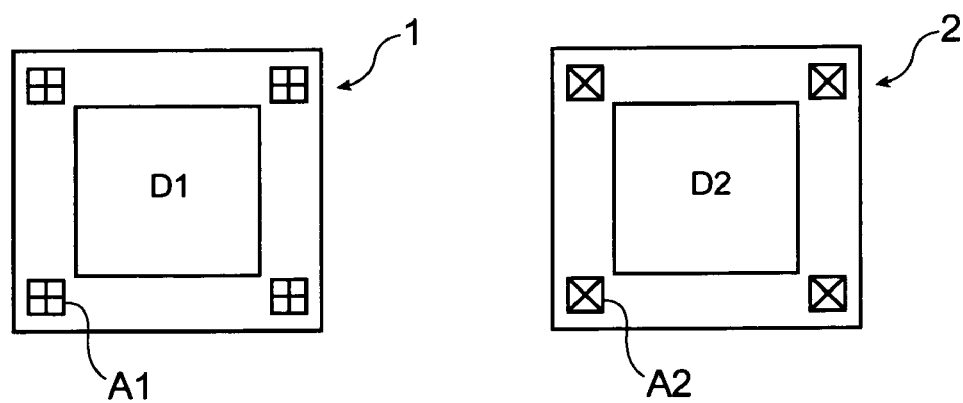
FIGS. 11A and 11B are two-dimensional diagrams schematically showing an original Cr mask (an original reticle) for producing a holographic mask.
Figures 12A, 12B:
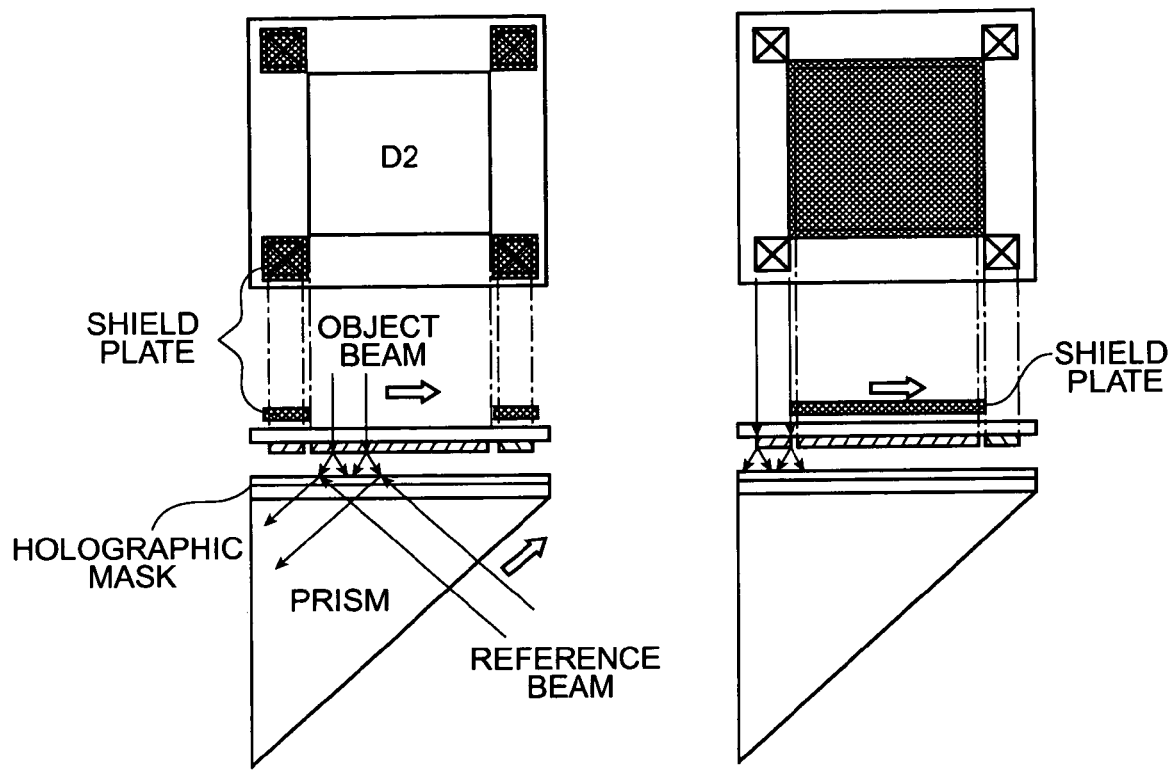
FIGS. 12A and 12B are diagrams schematically showing procedures on the holographic mask (the second mask), that in the recording of a device area and that in the recording of alignment marks, respectively.

Them, as shown in FIG. 10, an exposed substrate 210, instead of an original mask 302, on which a second light sensitive material film 212b is formed on the first circuit pattern is placed on the position where the original mask 302 has been placed. Then, an exposing beam L3 is irradiated onto the hologram recording surface 202 through the prism 201, from the opposite direction of the reference beam L2 in FIG. 9A (from the output direction of the reference beam L3), to expose the second light sensitive material film 212b. Here, the prism 201 is turned around so that the inclined plane of the prism 201 may face the input direction of the exposing beam L3, the holographic mask 200b being refixed on the prism 201.

The procedure will now be described more specifically. First, the exposed substrate 210 on which a second light sensitive material film 212b is formed and the holographic mask 200b are aligned by superposing the alignment marks A111, A112, A113, A114, and so forth that are formed on the exposed substrate 210 (refer to FIG. 2) and the alignment marks P12, P22, P32, and P42 that are formed on the holographic mask 200b (refer to FIG. 9B). Specifically, as shown in FIG. 1, after the holographic mask 200b and the exposed substrate 210 are placed on the predetermined position, an overlapping image of the holographic mask 200b and the exposed substrate 210 is imported through the vertical surface of the prism 201 by the microscope 292 that is placed so as to be able to monitor each alignment mark. The image imported by the microscope 292 is sent to an alignment error sensor 294 as an image signal to extract characterizing points from the overlapping image of the alignment marks. The position of the intersection of the cross of the alignment mark A111 and the position of the intersection of an "x" of the alignment mark P12, for example, are extracted to calculate the distance between the intersections. The distance information is sent to the first information processing unit 230 to align, by driving the stage system 222, the holographic mask 200b and the exposed substrate 210 so that the distance may be dissolved. Here, the alignment is done according to the method described above (refer to FIGS. 2 and 4).

Then, an exposing beam L3 is exposed onto the hologram recording surface 202. Alignment marks corresponding to the alignment marks P12, P22, P32, and P42 on the holographic mask 200b are formed on the light sensitive material film 212b, along with a second circuit pattern corresponding to the interference pattern 320 that is recorded on the hologram recording surface 202. An example of the alignment marks and a second circuit pattern is same with the pattern shown in FIG. 4. Then, necessary procedures, such as development and etching, are done to complete a second patterning.

In the case where a pattern exposure is done, using a unit, such as a shutter, on the alignment marks in the shape of an "x" on the holographic mask 200b, the alignment marks in the shape of an "x" on a holographic mask 200b for a second circuit pattern (for the upper layer) are not patterned, during the combined exposure, on the area for the alignment marks in the shape of a cross (for the lower layer) on the exposed substrate 210, making them reusable for future exposures.

Repeating the procedure described in FIGS. 9 and 10 in this way also allows a third patterning, a forth patterning, and so forth.

A method for manufacturing a thin film device substrate according to an embodiment of the invention is applicable for the production, for example, of pixel circuits composing pixels for electro-optic devices, such as an EL display and a liquid crystal display, and also for the production of drivers (integrated circuits) that controls the pixel circuits. In addition to the production of electro-optic devices, it is also applicable for the production of various devices. It is applicable for various memories, such as FeRAM (ferroelectric RAM), SRAM, DRAM, NOR RAM, NAND RAM, floating gate nonvolatile memory, and Magnetic RAM (MRAM). It is also applicable for sensors that are integrated using a thin film transistor (TFT), bank cards having CPUs, and so forth. Further, it is also applicable for the production of low-cost tags having a minute circuit chip (IC chip) for non-contact communication systems using microwaves.

According to an aspect of the invention, a needed area for alignment marks on an object to be exposed can be reduced while minimum permissible intervals are kept among alignment marks on a same exposed mask. Further, an aspect of the invention also provides industrial applicability as a method for aligning an exposed mask that allows the reuse of alignment marks on a object to be exposed and as a method for manufacturing a thin film device substrate that can form integrated devices with high density.

What is claimed is:

1. A method for aligning exposure masks using a plurality of holographic masks on which alignment marks are formed, the method comprising:
   aligning a position of a holographic mask toward an object to be exposed,
   a first direction from a first area on the object to be exposed toward a first alignment mark on the object intersecting a second direction from a second area adjacent to the first area toward a second alignment mark on the object,
   the first alignment mark being used for aligning the object with a holographic mask in an exposure of the first area, and
   the second alignment mark being used for aligning the object with a holographic mask in an exposure of the second area.

2. The method according to claim 1, wherein the holographic mask to be used in the exposure onto the first area has a form that allows at least the other areas to be shielded.

3. A method for manufacturing a thin film device substrate using a holographic exposure that includes a pattern exposure using a plurality of holographic masks on which alignment marks are formed, the method comprising:
   aligning an exposure mask using the method for aligning exposure masks according to claim 1; and
   irradiating an exposing beam onto the object to be exposed through the holographic masks as a way of patterning.

4. A method for manufacturing a thin film device substrate using a holographic exposure that includes a pattern exposure using a plurality of holographic masks on which alignment marks are formed, the method comprising:
   recording desired patterns, including alignment marks, on the holographic masks;
   aligning an exposure mask using the method for aligning exposure masks according to claim 1; and irradiating an exposing beam onto the object to be exposed through the holographic masks as a way of patterning.

5. A method for manufacturing a thin film device substrate according to claim 3, wherein alignment marks are produced on the object to be exposed during a first pattern exposure onto the object to be exposed.

6. The method according to claim 1, the holographic mask being used having a form that allows at least the second area to be shielded when the first area is exposed.

7. A method of aligning exposure masks using a plurality of holographic masks on which alignment marks are formed, the method comprising:

aligning a position of a holographic mask toward an object to be exposed, a plurality of first alignment marks formed on the object being used for aligning the object with a holographic mask in a first exposure of a first area of the object, and a plurality of second alignment marks formed on the object being used for aligning the object with a holographic mask in a second exposure of a second area of the object, a part of the first area being located between two second alignment marks of the plurality of second alignment marks, and a part of the second area being located between two first alignment marks of the plurality of first alignment marks.

* * * * *